United States Patent [19]

Clarke

[11] Patent Number: 5,061,360
[45] Date of Patent: Oct. 29, 1991

[54] APPARATUS FOR DEPOSITING A THIN FILM OF A SPUTTERED MATERIAL ON A MEMBER

[75] Inventor: Peter J. Clarke, Santa Barbara, Calif.

[73] Assignee: Sputtered Films, Inc., Santa Barbara, Calif.

[21] Appl. No.: 470,710

[22] Filed: Jan. 26, 1990

[51] Int. Cl.⁵ ............................................. C23C 14/35
[52] U.S. Cl. .......................... 204/298.18; 204/192.12; 204/192.2; 204/298.12
[58] Field of Search ........... 204/192.12, 192.2, 298.17, 204/298.18, 298.19, 298.12

[56] References Cited

U.S. PATENT DOCUMENTS

| | | | |
|---|---|---|---|
| 4,200,510 | 4/1980 | O'Connell et al. | 204/192.12 |
| 4,414,086 | 11/1983 | Lamont, Jr. | 204/192.2 |
| 4,564,435 | 1/1986 | Wickersham | 204/298.12 |
| 4,622,122 | 11/1986 | Landau | 204/298.19 |

Primary Examiner—Aaron Weisstuch
Attorney, Agent, or Firm—Ellsworth R. Roston; Charles H. Schwartz

[57] ABSTRACT

Electrons released by an anode are attracted by an electric field toward a target cathode in a cavity to ionize argon atoms in the space between the anode and target. Magnets produce a magnetic field in the cavity in a direction perpendicular to the electrical field to produce a trapping spiral movement of the electrons in the cavity, thereby enhancing the ionization of the gaseous molecules. The ions bombard the target to emit sputtered atoms which are deposited on a semi-conductor wafer. The target may have a frusto-conical configuration defined by a single member or by a plurality of segmental tiles formed from different materials to provide for a deposition of a mixture of such different materials on the wafer. The target may be magnetizable. Under such circumstances, a permanent magnet may be disposed in the target with a polarity relative to the magnetic field to divert the magnetic field to the space external to the frusto-conical surface of the target so as to facilitate the ionization of atoms of the neutral gas by the electrons. Alternatively, the target may be hollow to provide a saturation of the magnetic field in the target and a resultant diversion of the magnetic field to the space external to the frusto-conical surface of the target to facilitate the trapping of the electrons in such space and the ionization of atoms of the neutral gas by the electrons.

15 Claims, 3 Drawing Sheets

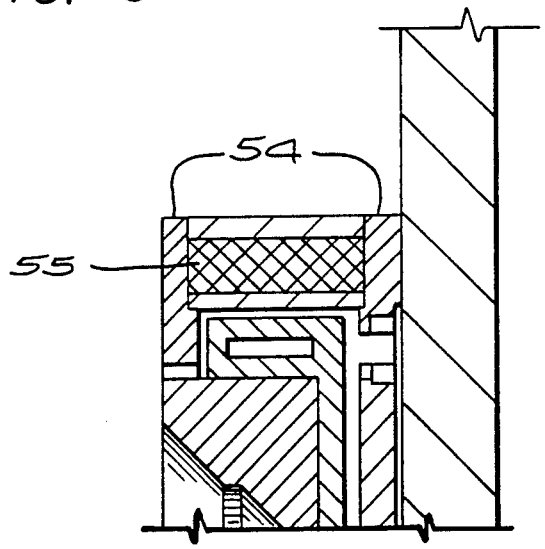
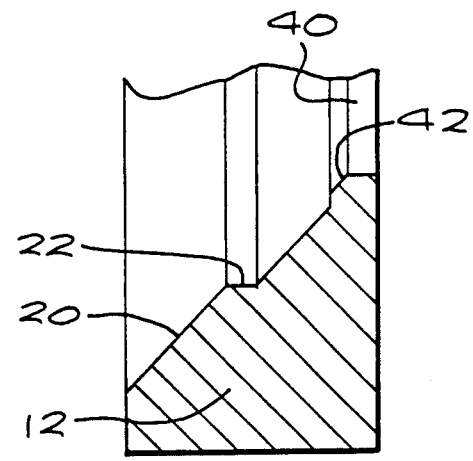
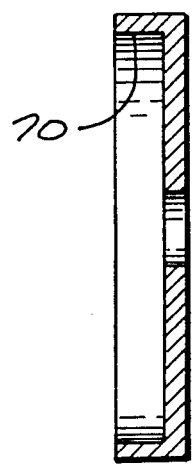
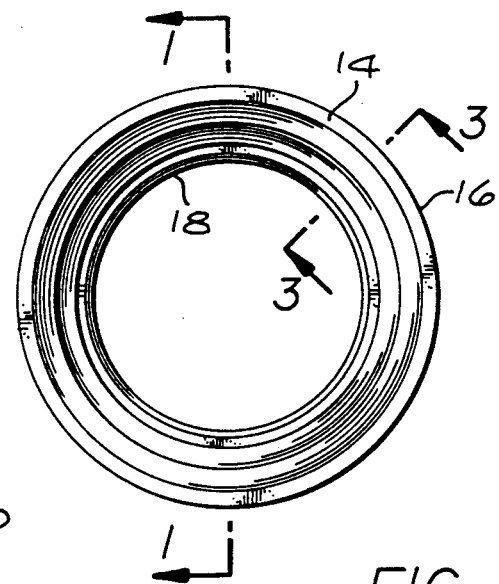
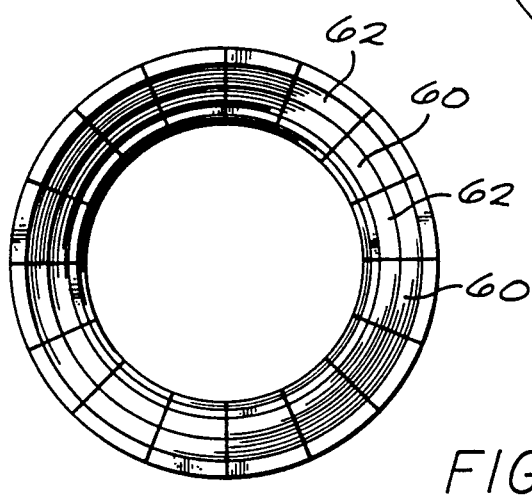

APPARATUS FOR DEPOSITING A THIN FILM OF A SPUTTERED MATERIAL ON A MEMBER

This invention relates to apparatus for depositing sputtered atoms on articles such as wafers for integrated circuits. More particularly, this invention relates to apparatus including a target having magnetizable properties and constructed to deposit sputtered atoms from the target in a uniform layer on a wafer.

Apparatus has been in use for some time for depositing sputtered atoms on a wafer to produce a layer of a material defined by the sputtered atoms. The apparatus now in use produces such a deposition by bombarding a target with ions. For example, when a layer of iron is to be deposited on a wafer, the target may be made from iron. When the target is bombarded with ions of a neutral gas such as argon, the target emits sputtered atoms of the iron. These sputtered atoms travel to the wafer and become deposited on the wafer to produce a substantially uniform, layer on the wafer of the material defined by the sputtered atoms.

To deposit sputtered atoms of the iron from the target on the wafer, electrons are trapped above the target, which serves as a cathode. The electrons are subjected to a magnetic field which increases the distance of travel between the anode and the target by producing a movement of the electrons in a helical path. As the electrons move in the helical path, they strike molecules of a neutral gas such as argon in a cavity between the anode and the target and ionize the molecules of argon. The ions of argon then impinge on the target and cause sputtered atoms of the material of the target to be liberated. These sputtered atoms then travel to the wafer for deposition on the wafer.

As will be appreciated, it is important that lines of flux in the magnetic field be provided in space to produce a movement of the electrons in a helical path in such space and thereby facilitate the production of ions from the molecules of the neutral gas. This is no problem when the target is made from a non-magnetizable material since such a material does not interfere with the normal distribution of the lines of the magnetic field in space. However, the target is sometimes made from a magnetizable material such as iron. When this occurs, the target attracts the magnetic field and thereby inhibits the passage of lines of the magnetic field through the space adjacent the target. This inhibits the formation of ions from molecules of the neutral gas and thereby inhibits the deposition of sputtered atoms of the target material on the wafer. The problems discussed in this paragraph have been known for sometime. However, no one has been able to solve the problem until now.

This invention provides apparatus for insuring that lines of flux in the magnetic field travels in the space external a target even when the target is made from a magnetizable material. In this way, a layer of a material is uniformly deposited on a wafer in a relatively short period of time even when the material has magnetic properties.

In one embodiment of the invention, electrons released by an anode are attracted by an electrical field toward a target to ionize argon atoms in the space between the anode and the target. Magnets produce a magnetic field in the cavity in a direction perpendicular to the electrical field to produce a spiral movement of the electrons toward the target, thereby enhancing the ionization of the gaseous molecules. The ions bombard the target to emit sputtered atoms which are deposited on a semi-conductor wafer.

The target may have a frusto-conical configuration defined by a single member or by a plurality of segmental tiles formed from different materials to provide for a deposition of a mixture of such different materials on the wafer. The target may be magnetizable. Under such circumstances, a permanent magnet may be disposed in the target with a polarity relative to the magnetic field to divert the magnetic field to the space external to the frusto-conical surface of the target so as to facilitate the ionization of atoms of the neutral gas by the electrons. Alternatively, the target may be hollow to provide a saturation of the magnetic field in the target and a resultant diversion of the magnetic field to the space external to the frusto-conical surface of the target to facilitate the trapping of the electrons in such space and the ionization of atoms of the neutral gas by the electrons.

In the drawings:

FIG. 2 is an enlarged fragmentary view, similar to that shown in FIG. 1, of the target and a clamp in the apparatus of FIG. 1 for holding the target in a fixed position and for cooling the target;

FIG. 3 is a fragmentary sectional view of the apparatus shown in FIG. 1 and is taken substantially on the line 3—3 of FIG. 4;

FIG. 4 is a front view of the apparatus shown in FIG. 1;

FIG. 5 is a front view of the target in the apparatus shown in FIG. 1 and illustrates an alternate embodiment of a target which may be used in the apparatus shown in FIG. 1;

FIG. 6 illustrates the appearance of the target after the material in the target has become substantially depleted by deposition on wafers;

Figure 7:
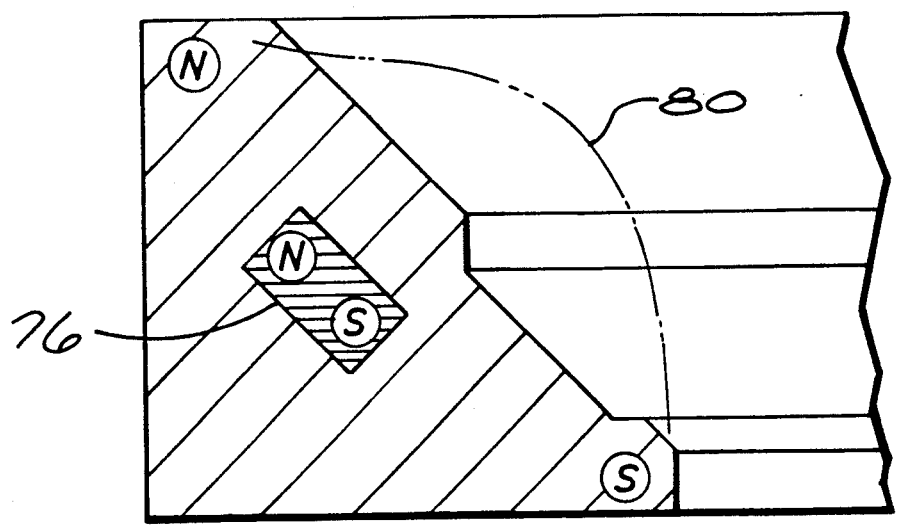
Figure 8:
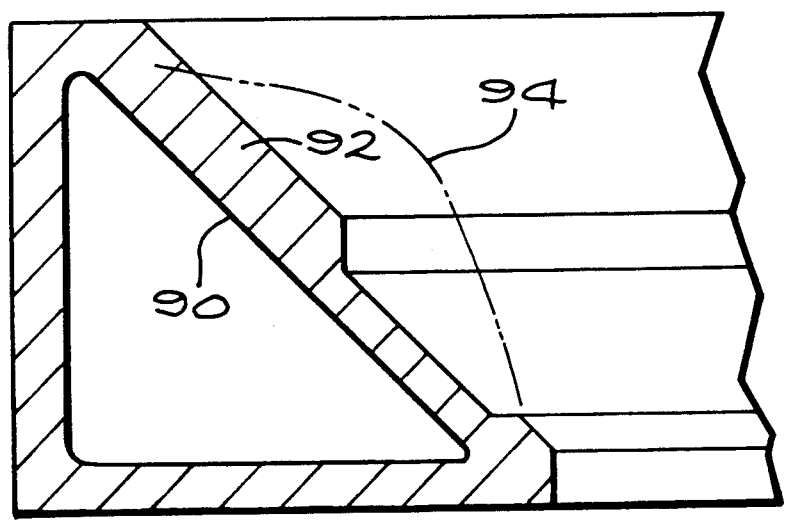

FIG. 7 is a view, similar to that shown in FIG. 2, of a target which has been modified in a first manner to accomplish the purposes of this invention when the target is made from a magnetizable material; and FIG. 8 is a view, similar to that shown in FIG. 2, of a target which has been modified in a second manner to accomplish the purposes of this invention when the target is made from a magnetizable material.

Figure 1:
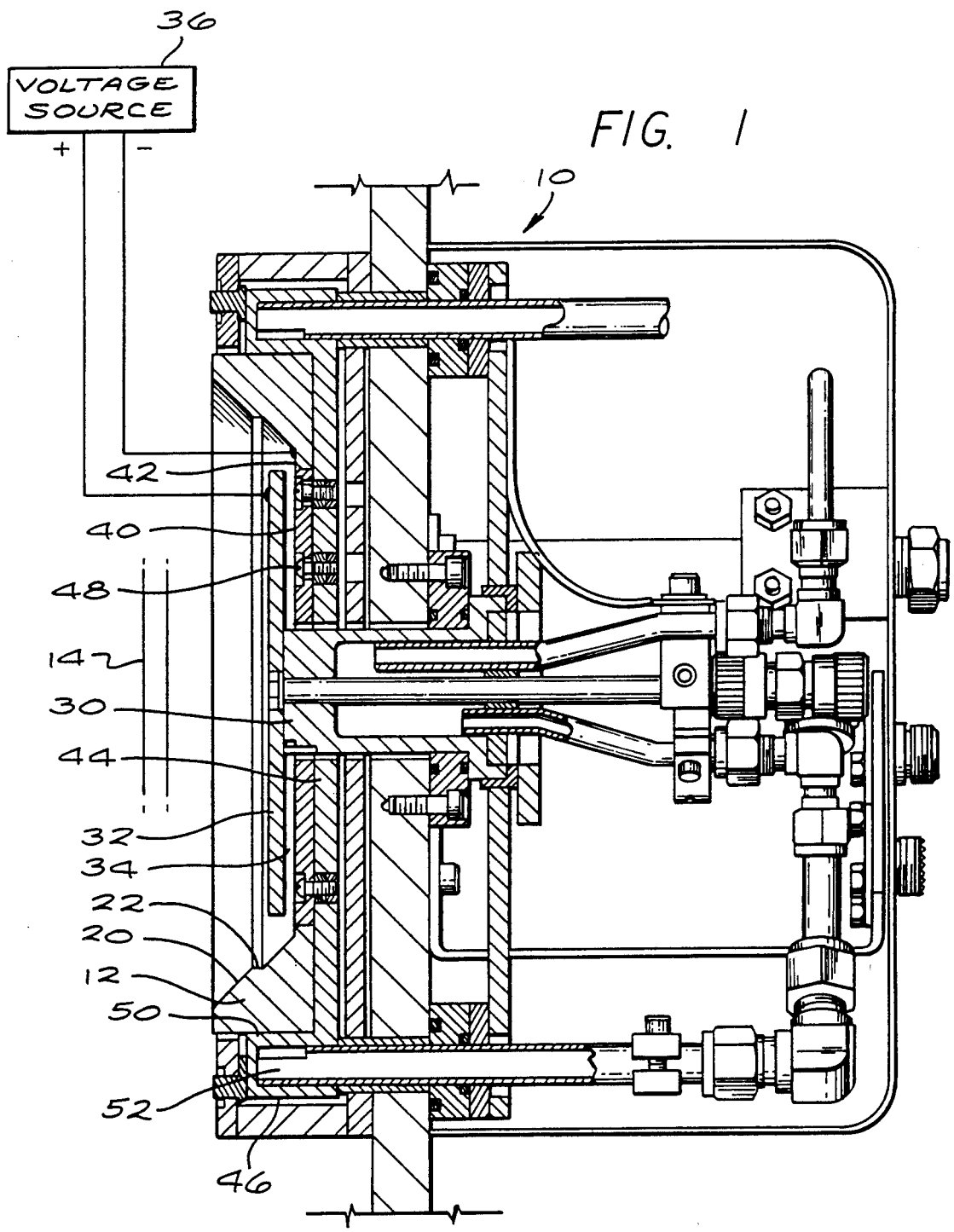
FIG. 1 is a fragmentary sectional view, in side elevation, of apparatus constituting one embodiment of the invention for depositing material from a target on a wafer and is taken substantially on the line 1—1 of FIG. 4.

In one embodiment of the invention, apparatus generally indicated at 10 in, FIG. 1 is provided for depositing sputtered atoms from a target 12 on a member. As one alternative, the member may constitute a wafer 14 which is used in the semi-conductor industry. The wafer 14 may be in the form of a thin disc made from a suitable material such as silicon. The wafer may hold a plurality of dies, each generally of identical construction and each included, when completed, in an integrated circuit chip defining complex electrical circuitry. Each die may be quite small (e.g. ¼"×¼") so that a considerable number of dies can be formed on a single wafer.

The target 12 may be a unitary member, preferably with an annular configuration, as shown in FIG. 4. The target 12 may be defined by an annular external periphery 16 (FIG. 4) and may be provided with a centrally disposed opening defining an internal periphery 18. The target 12 may have a frusto-conical surface 20 (FIG. 1) with a step 22 in the frusto-conical surface at an intermediate position along the length of the frusto-conical surface. The target 12 may be made from a suitable material such as aluminum or titanium or it may be made from a suitable material, such as a ferromagnetic material, having magnetizable properties.

The apparatus 10 includes an anode 30 radially and axially separated from the target 12. An anode plate 32 extends radially from the anode 30 to shield a clamp 40 from the sputtered atoms emitted by the target 12. A chamber or cavity 34 is formed between the anode plate 32 and the target 12. The chamber 34 holds molecules of a neutral gas such as argon. An electrical field is provided between the anode 30 and the target 12, which may serve as a cathode, by connecting the anode and target respectively to the positive and negative terminals of a power supply 36.

The clamp 40 is disposed in the centrally disposed opening of the target 12 in abutting relationship with the internal periphery 18 of the target. The clamp 40 has a shoulder 42 (FIGS. 1 and 2) which overlays the dwell portion 26 of the target 12. The clamp 40 may be made from a suitable material such as copper (input heat conduction). The clamp 40 is disposed against a support portion 44 of a cooling member 46 and is attached to the support portion of the cooling member as by screws 48.

The cooling member 46 has a portion 50 which abuts the external periphery 16 of the target 12. A passageway 52 is disposed in the portion 50 to provide for the flow of a fluid such as water to cool the member 46. A pair of pole pieces 54 (FIG. 3) are disposed at the opposite ends of the passageway to create a magnetic field in the chamber 34.

The voltage difference between the anode 30 and the target 12 at a low pressure causes a glow discharge including electrons. The electrons move in a spiral path above the target 12 because the magnetic field produced in the chamber 34 by the magnets 54 has a component in a direction perpendicular to the electrical field. Because of this spiral path, the distance travelled by the electrons increases. This provides the electrons with an ample opportunity to strike argon atoms and to ionize the argon atoms.

The argon atoms travel to the frusto-conical surface 20 of the target 12 and cause sputtered atoms to be released from this surface when they impinge on the surface. The sputtered atoms travel to the wafer 14 and become deposited on the wafer. As the material becomes depleted from the frusto-conical surface 20 of the target 12, the target becomes progressively worn until it reaches a configuration such as shown at 70 in FIG. 6. At that time, the target 12 is removed from the apparatus and is replaced by a new target.

As the sputtered atoms become released from the frusto-conical surface of the target 12, the target becomes heated. This would tend to cause the target to expand at both creep toward its external periphery 16 and its internal periphery 18 as shown in FIG. 4. However, the external periphery 16 of the target 12 is maintained in fixed position by its mechanical abutment with the portion 50 of the cooling member 46. This cooling action results from the flow of a cooling fluid such as water through the passageway 52 in the cooling member 46.

In like manner, the inner periphery 18 of the target 12 is maintained in fixed position by a mechanical abutment with the clamp 40 and by the cooling action of the cooling member 46. The inner periphery 18 of the target 12 is also maintained in fixed position by the creep migration of sputtered atoms from the target 12 to the clamp 40. By maintaining the inner and outer peripheries of the target 12 in fixed position, the deposition of the sputtered atoms from the target 12 in a uniform layer on the wafer 14 is enhanced. Furthermore, the target 12 is able to become depleted of the material on the target by deposition of sputtered atoms on the wafer 14. The depleted target is illustrated at 70 in FIG. 6.

In the embodiment shown in FIG. 5, a target is formed from a plurality of segments or tiles 60 and 62. Particular segments or tiles 60 may be made from a suitable material such as aluminum on a ferromagnetic material such as iron and other segments or tiles 62 may be made from a suitable material such as titanium or from the ferromagnetic material such as iron. Each of the segments and tiles 60 and 62 may have a frusto-conical configuration in cross-section corresponding to the cross sectional configuration of the target 12 in FIGS. 1 and 2. The material deposited on the wafer 14 at each position on the wafer is a combination of the materials of the segments or tiles 60 and 62. The ratio of these materials on the wafer 14 at each position corresponds to the ratio of the number of the segments 60 to the number of the segments 62.

It may sometimes happen that the target 12 in FIG. 2 or the segments 60 or 62 in FIG. 5 may be made from a magnetizable material such as an iron. Under such circumstances, the magnetic field (or the magnetic lines of flux) may pass through the target 12 or the segments 60 or 62 without passing through the space external to the target or the segments. This inhibits any action of any magnetic flux on the electrons in the space adjacent to the target 12 or the segments 60 or 62 in ionizing the atoms of the neutral gas such as argon. This accordingly inhibits any deposition of the material of the target 12 or the segments 60 or 62 on the wafer 14.

In the embodiment of the invention shown in FIG. 7, a permanent magnet 76 is disposed in the target 12. The poles of the permanent magnet 76 are disposed such that the pole at the upper end of the permanent magnet 76 corresponds to the pole produced by the magnetic field at the upper end of the target 12. For example, the pole at the upper end of the permanent magnet 76 may be a north pole, as may the pole produced by the magnetic field at the upper end of the target 12. This causes the magnetic flux produced by the north pole of the permanent magnet 76 to repel the magnetic flux passing through the target 12 from the north pole to the south pole of the target. As a result, the pole at the upper end of the permanent magnet 76 tends to divert the magnetic flux from travelling through the target 12. This causes the magnetic flux to be diverted into travelling through the space external to the target 12 at the frusto-conical surface of the target as indicated schematically at 80 in FIG. 7.

The electrons accordingly travel in a helical path between the top and bottom of the target in the space adjacent to the frusto-conical surface of the target. When the electrons approach the bottom surface of the housing, they are repelled by the negative voltage on the target. The electrons accordingly move to a position near the top of the target 12 where they are again repelled by the target. In this way, the electrons oscillate between the top and bottom of the target 12. During such oscillatory movements, the electrons strike argon atoms and ionize these atoms. The ions then impinge on the frusto-conical surface of the target 12 and cause sputtered atoms to be released for deposition on the wafer 14. As will be appreciated, when permanent magnets are disposed in segments 60 or 62 which are made from a magnetizable material, the same action will occur in each of such segments 60 and 62 as discussed above.

The embodiment shown in FIG. 8 accomplishes the same result as, but in a different manner than, the embodiment shown in FIG. 7. In the embodiment shown i FIG. 8, the target 12 is formed with an opening 90. This causes the magnetic flux in the target 12 to pass through the relatively narrow passageway 92. The flux travelling through the narrow passageway 92 accordingly tends to become saturated. Because of this, some of the magnetic flux tends to pass through the space external to the frusto-conical surface of the target 12 as indicated at 94 in FIG. 8. This flux tends to facilitate the formation of argon ions by the impingement of the oscillating electrons above the target 12 on the argon atoms. The argon ions in turn tend to produce the release of atoms from the frusto-conical surface of the target 12 for deposition on the wafer 14. As in the embodiment of FIG. 7, the same principles discussed in this paragraph take place when openings are provided in the segments 60 or 62.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination for producing a deposition on a wafer,
   an anode,
   a target spaced from and facing the anode to serve as a cathode, the target having properties of emitting sputtered atoms when bombarded by gaseous ions and of directing the sputtered atoms to the wafer,
   means for defining a cavity between the anode and the target for reeving atoms of a neutral gas,
   means for creating an electrical field between the anode and the target at a low pressure to produce a migration of the electrons through the cavity and an ionization of atoms of the neutral gas in the cavity, and
   means for producing a magnetic field int eh cavity for increasing the distance of travel of the electrons from the target to the anode to enhance the ionization of atoms of the neutral gas in the cavity,
   the target being made from a magnetizable material, the target being provided, with a continuous surface facing the anode and with an internal construction, to divert lines of flux in the magnetic field into passing through the space external to the target so as to enhance the movement of the electrons through paths providing, external to the target, for the ionization of the atoms of the neutral gas.

2. In a combination as set forth in claim 1,
   the target having an external periphery and a central opening defining an internal periphery,
   a clamp disposed in the central opening and overlapping the external periphery of the target to maintain and cool the target in fixed position and to inhibit a migration of sputtered atoms from the target, and
   a cooling member disposed adjacent the periphery of the target to cool the periphery of the target.

3. In combination for producing a deposition on a wafer,
   an anode,
   a target spaced from and facing the anode to serve as a cathode, the target having properties of emitting sputtered atoms when bombarded by gaseous ions and of directing the sputtered atoms to the wafer,
   means for defining a cavity between the anode and the target for receiving atoms of a neutral gas,
   means for creating an electrical field between the anode and the target at a low pressure to produce a migration of the electrons through the cavity and an ionization of atoms of the neutral gas in the cavity, and
   means for producing a magnetic field in the cavity for increasing the distance of travel o the electrons from the target to the anode to enhance the ionization of atoms of the neutral gas in the cavity,
   the target being made from a magnetizable material, the target being constructed to divert the magnetic field into passing through the space external to the target so as to enhance the movement of the electrons through paths providing, external to the target, for the ionization of the atoms of the neutral gas, and
   a permanent magnet disposed in the target with a polarity relative to that of the magnetic field means to divert lines of flux in the magnetic field into passing through the space external to the target so as to enhance the movement of the electrons through paths, external to the target, for the ionization of the molecules of the neutral gas.

4. In combination for producing a deposition on a wafer,
   an anode,
   a target spaced from and facing the anode to serve as a cathode, the target having properties of emitting sputtered atoms when bombarded by gaseous ions and of directing the sputtered atoms to the wafer,
   means for defining a cavity between the anode and the target for receiving atoms of a neutral gas,
   means for creating an electrical field between the anode and the target at a low pressure to produce a migration of the electrons through the cavity and an ionization of atoms of the neutral gas in the cavity, and
   means for producing a magnetic field in the cavity for increasing the distance of travel of the electrons from the target to the anode to enhance the ionization of atoms of the neutral gas in the cavity,
   the target being made from a magnetizable material, the target being constructed to divert the magnetic field into passing through the space external to the target so as to enhance the movement of the electrons through paths providing, external to the target, for the ionization of the atoms of the neutral gas,
   the target being provided with an internal opening to provide a saturation of the magnetic field passing through the target, thereby producing a diversion of lines of flux in the magnetic field into passing through the space external to the target so as to enhance the movement of the electrons through paths, external to the target, for the ionization of the atoms of the neutral gas.

5. In combination for producing a deposition on a wafer,
   an anode,
   a target spaced from and facing the anode and serving as a cathode and having properties of emitting sputtered atoms when bombarded by ions, the target being defined by an external periphery and a central opening defining an internal periphery, the target being continuous at the surface facing the anode,
   first means for defining a cavity between the anode and the target and for holding atoms of a neutral gas in the cavity for the creation of ions to bombard the target,
   second means for creating an electrical field between the anode and the target at a low pressure to produce a movement in the cavity of electrons from the target, and
   third means for creating a magnetic field in the cavity in a direction having a component substantially perpendicular to the electrical field to produce an oscillating movement of the electrons in a helical path in the cavity for enhancing the ionization of the atoms of the neutral gas in the cavity,
   the target having magnetizable properties,
   the target being constructed internally, and being provided with a frusto-conical external configuration facing the anode, to provide for the movement of the electrons through the space external to the target to facilitate the creation of ions from atoms of the neural gas in the cavity, the target being responsive to the ions to emit sputtered atoms for deposition on the wafer.

6. In a combination as set forth in claim 5,
   the target being annular and having a frusto-conical configuration in section to provide for the release of sputtered atoms from the frusto-conical surface of the target.

7. In a combination as set forth in claim 5,
   the target being in the from of segmented tiles each having a frusto-conical configuration in section to provide for the release of sputtered atoms from the frusto-conical surfaces of the tiles.

8. In combination for producing a deposition on a wafer,
   an anode,
   a target spaced from and facing the anode and serving as a cathode and having properties of emitting sputtered atoms when bombarded by ions, the target being defined by an external periphery and a central opening defining an internal periphery,
   first means for defining a cavity between the anode and the target and for holding atoms of a neutral gas in the cavity for the creation of ions to bombard the target,
   second means for creating an electrical field between the anode and the target at a low pressure to produce a movement in the cavity of electrons from the target, and
   third means for creating a magnetic field int h cavity in a direction having a component substantially perpendicular to the electrical field to produce an oscillating movement of the electrons in a helical path in the cavity for enhancing the ionization of the atoms of the neutral gas in the cavity,
   the target having magnetizable properties,
   the target being constructed to provide for the movement of the electrons through the space external to the target to facilitate the creation of ions from atoms of the neutral gas in the cavity, the target being responsive to the ions to emit sputtered atoms for deposition on the wafer,
   a permanent magnet disposed in the target with a polarity relative to the magnetic field to provide for saturation of magnetic flux in the target and for a trapping of the movement of the electrons in the space external to the target to facilitate the creation of ions from atoms of the neutral gas in the cavity.

9. In combination for producing a deposition on a wafer,
   an anode,
   a target spaced from and facing the anode and serving as a cathode and having properties of emitting sputtered atoms when bombarded by ions, the target being defined by an external periphery and a central opening defining an internal periphery,
   first means for defining a cavity between the anode and the target and for holding atoms of a neutral gas in the cavity for the creation of ions to bombard the target,
   second means for creating an electrical field between the anode and the target at a low pressure to produce a movement in the cavity of electrons from the anode, and
   third means for creating a magnetic field in the cavity in a direction having a component substantially perpendicular to the electrical field to produce an oscillating movement of the electrons in a helical path in the cavity for enhancing the ionization of the atoms of the neutral gas in the cavity,
   the target having magnetizable properties,
   the target being constructed to provide for the movement of the electrons through the space external to the target to facilitate the creation of ions from atoms of the neutral gas in the cavity, the target being responsive to the ions to emit sputtered atoms for deposition on the wafer,
   the target being constructed with a continuous surface facing the anode,
   the target being hollow to provide for a saturation of the magnetic flux in the target to facilitate the creation of the magnetic flux in the space external to the target to facilitate the creation of ions from atoms of the neutral gas in the cavity.

10. In combination for producing a deposition on a wafer,
    an anode,
    a target spaced from and facing the anode to serve as a cathode, the target having properties of emitting sputtered atoms when bombarded by gaseous ions and of directing the sputtered atoms to the wafer, the target being concentric with the anode and having a hollow annular configuration, the surface of the target facing the anode being disposed at the inner end of the hollow annular configuration, the target being continuous at the surface facing the anode,
    means for defining an annular cavity between the anode and the target for receiving atoms of a neutral gas,
    means for creating an electrical field between the anode and the target at a low pressure to produce a migration of the electrons through the cavity and an ionization by the electrons of atoms of the neutral gas in the cavity, and means for producing a magnetic field int e cavity for increasing the distance of travel of the electrons between the anode and the surface of the target facing the anode to enhance the ionization of atoms of the neutral gas in the cavity, the target being made from a magnetizable material, the target being constructed internally with at least one discontinuity to divert lines of flux in the magnetic field into passing through the space external to the of the target facing the anode so as to enhance the movement of the electrons through paths providing for the ionization of the atoms of the neutral gas in the annular cavity.

11. In a combination as set forth in claim 10,
the target being formed from tiles each having the configuration of a segment of a circle in a plane substantially parallel to the anode.

12. In combination for producing a deposition on a wafer,
an anode,
a target spaced from ad facing the anode to serve as a cathode, the target having properties of emitting sputtered atoms when bombarded by gaseous ions and of direction the sputtered atoms to the wafer, the target being concentric with the anode and having a hollow annular configuration, the surface of the target facing the anode being disposed at the inner end o the hollow annular configuration, the target being continuous at the surface facing the anode,
means for defining an annular cavity between the anode and the target for receiving atoms of a neutral gas,
means for creating an electrical field between the anode and the target at a low pressure to produce a migration of the electrons through the cavity and an ionization by the electrons of atoms of the neutral gas in the cavity, and
means for producing a magnetic field in the cavity for increasing the distance of travel of the electrons between the anode and the surface of the target facing the anode to enhance the ionization of atoms of the neutral gas in the cavity,
the target being made from a magnetizable material, the target being constructed internally with at least one discontinuity to divert lines of flux in the magnetic field into passing through the space external to the of the target facing the anode so as to enhance the movement of the electrons through paths providing for the ionization of the atoms of the neutral gas in the annular cavity,
the target being formed from tiles each having the configuration of a segment of a circle in a plane substantially parallel to the anode,
the segmented tiles being hollow to provide for a saturation of the magnetic field passing through the tiles and a diversion of the magnetic field to the space external to the of the tiles facing the anode to facilitate the ionization of atoms of the neutral gas in the annular cavity by the electrons released from the anode.

13. In combination for producing a deposition on a wafer,
an anode,
a target spaced rom and facing the anode to serve as a cathode, the target having properties of emitting sputtered atoms when bombarded by gaseous ions and of directing the sputtered atoms to the wafer, the target being concentric with the anode and having a hollow annular configuration, the surface of the target facing the anode being disposed at the inner end of the hollow annular configuration, the target being formed from a plurality of tiles.
means for defining an annular cavity between the anode and the target for receiving atoms of a neutral gas,
means for creating an electrical field between the anode and the target at a low pressure to produce a migration of the electrons through the cavity and an ionization by the electrons of atoms of the neutral gas in the cavity, and
means for producing a magnetic field in the cavity for increasing the distance of travel of the electrons between the anode and the surface of the target facing the anode to enhance the ionization of atoms of the neutral gas in the cavity,
the target being made from a magnetizable material, the target being constructed to divert lines of flux in the magnetic field into passing through the space external to the surface of the target facing the anode so as to enhance the movement of the electrons through paths providing for the ionization of the atoms of the neutral gas in the annular cavity, and
permanent magnets in the tiles with a polarity relative to the magnetic field to divert lines of flux in the magnetic field to the space external to the surfaces of the tiles facing the anode to facilitate the ionization of atoms of the neutral gas in the annular cavity by the electrons released by the anode.

14. In combination for producing a deposition on a wafer,
an anode,
a target spaced from and facing the anode to serve as a cathode, the target having properties of emitting sputtered atoms when bombarded by gaseous ions and of directing the sputtered atoms to the wafer, the target being concentric with the anode and having a hollow annular configuration, the surface of the target facing the anode being disposed at the inner end of the hollow annular configuration,
means for defining an annular cavity between the anode and the target for receiving atoms of a neutral gas,
means for creating an electrical field between the anode and the target at a low pressure to produce a migration of the electrons through the cavity and an ionization by the electrons of atoms of the neutral gas in the cavity, and
means for producing a magnetic field in the cavity for increasing the distance o travel of the electrons between the anode and the surface of the target facing the anode to enhance the ionization of atoms of the neutral gas in the cavity,
the target being made from a magnetizable material, the target being constructed to divert lines of flux in the magnetic field into passing through the space external to the surface of the target facing the anode so as to enhance the movement of the electrons through paths providing for the ionization of the atoms of the neutral gas in the annular cavity,
the target constituting a single member hollow throughout its annular configuration to provide for a saturation of the magnetic field passing through the target and a diversion of lines of flux in the magnetic field to the space external to the surfaces of the target facing the anode to facilitate the ionization of atoms of the neutral gas in the annular cavity by the electrons released by the anode.

15. In combination for producing a deposition on a wafer, an anode, a target spaced from an facing the anode to serve as a cathode, the target having properties of emitting sputtered atoms when bombarded by gaseous ions and of directing the sputtered atoms to the wafer, the target being concentric with the anode and having a hollow annular configuration, the surface of the target facing the anode being disposed at the inner end of the hollow annular configuration, means for defining an annular cavity between the anode and the target for receiving atoms of a neutral gas, means for creating an electrical field between the anode and the target at a low pressure to produce a migration of the electrons through the cavity and an ionization by the electrons of atoms of the neutral gas in the cavity, and means for producing a magnetic field in the cavity for increasing the distance o travel of the electrons between the anode and the surface of the target facing the anode to enhance the ionization of atoms of the neutral gas in the cavity, the target being made from a magnetizable material, the target being constructed to divert lines of flux in the magnetic field into passing through the space external to the surface of the target facing the anode so as to enhance the movement of the electrons through paths providing for the ionization of the atoms of the neutral gas in the annular cavity, and a permanent magnet disposed in an annular configuration in the target with a polarity relative to the magnetic field to divert lines of flux in the magnetic field to the space external to the surface of the target facing the anode to facilitate the ionization of atoms of the neutral gas in the annular cavity by the electrons released by the anode.

* * * * *